United States Patent
Tanaka et al.

(10) Patent No.: US 9,791,848 B2
(45) Date of Patent: Oct. 17, 2017

(54) DISPLAY APPARATUS

(71) Applicant: DMG MORI SEIKI CO., LTD., Nara (JP)

(72) Inventors: Shojiro Tanaka, Nara (JP); Sumihiro Kiyota, Nara (JP); Kyoichi Tateno, Sapporo (JP)

(73) Assignee: DMG MORI SEIKI CO., LTD., Nara (JP)

( * ) Notice: Subject to any disclaimer, the term of this patent is extended or adjusted under 35 U.S.C. 154(b) by 410 days.

(21) Appl. No.: 14/498,090

(22) Filed: Sep. 26, 2014

(65) Prior Publication Data

US 2015/0091898 A1 Apr. 2, 2015

(30) Foreign Application Priority Data

Sep. 30, 2013 (JP) .................................. 2013-204701

(51) Int. Cl.
*G06T 17/00* (2006.01)
*G05B 19/4061* (2006.01)
(Continued)

(52) U.S. Cl.
CPC ......... *G05B 19/4061* (2013.01); *G06F 17/50* (2013.01); *G06T 17/00* (2013.01); *G06T 19/20* (2013.01); *G05B 2219/49157* (2013.01); *G06T 2210/21* (2013.01); *G06T 2215/16* (2013.01); *G06T 2219/2012* (2013.01)

(58) Field of Classification Search
None
See application file for complete search history.

(56) References Cited

U.S. PATENT DOCUMENTS 6,452,604 B1 * 9/2002 Sato .................. G06T 17/00
345/619
2002/0113784 A1 * 8/2002 Feilmeier ............ G06F 1/1626
345/419
(Continued)

FOREIGN PATENT DOCUMENTS

JP 2005190102 7/2005

*Primary Examiner* — Andrew G Yang
(74) *Attorney, Agent, or Firm* — Miller, Matthias & Hull LLP

(57) ABSTRACT

A display apparatus has a display 40, a model data storage unit 37 storing therein three-dimensional model data of a movable structure and a structure having a possibility of interfere with the movable structure, a model generation unit 33 generating a three-dimensional model in which three-dimensional models of the structures are arranged in a three-dimensional space, an interference-caution-portion specifying unit 34 specifying a portion of the movable structure having a possibility of contact with an interfering structure as an interference caution portion when an interfering structure exists and specifying a leading portion of the movable structure in a moving direction as an interference caution portion when an interfering structure does not exist, and an image display unit 35 generating an image with the interference caution portion highlighted based on the three-dimensional model generated by the model generation unit 33 and displaying the image on the display 40.

5 Claims, 5 Drawing Sheets

(51) Int. Cl.
*G06F 17/50* (2006.01)
*G06T 19/20* (2011.01)

(56) References Cited

U.S. PATENT DOCUMENTS

| | | | |
|---|---|---|---|
| 2003/0075818 A1* | 4/2003 | Mörwald | B29C 45/76 264/40.1 |
| 2004/0181305 A1* | 9/2004 | Hertinger | G05B 19/4069 700/178 |
| 2009/0326556 A1* | 12/2009 | Diolaiti | A61B 1/00009 606/130 |
| 2010/0016999 A1* | 1/2010 | Takayama | G05B 19/0426 700/81 |
| 2012/0089247 A1* | 4/2012 | Kawauchi | B23Q 17/20 700/178 |

* cited by examiner

DISPLAY APPARATUS

FIELD OF THE DISCLOSURE

The present disclosure relates to a display apparatus which is connected to an NC machine tool for displaying at least an image of a movable structure of the NC machine tool.

BACKGROUND OF THE DISCLOSURE

In the field of numerically controlled industrial machinery such as machine tools and robots, conventionally, a mode in which an image relating to a movable structure such as a tool rest, a spindle head and a robot arm is displayed on a screen of a display apparatus has been adopted, and, by viewing this displayed image, an operator can recognize the operation state of the movable body without viewing the movable structure directly with his eyes.

As such an apparatus for displaying an image of a movable structure, a numerical controller as disclosed in the Patent Literature 1 mentioned below has conventionally been suggested. This numerical controller includes a video camera installed in the inside of a machine tool, display image generating means which, using video image data captured by the video camera and internal data of the numerical controller, generates display image data in which character information is superimposed on a video image, and a device for displaying the display image data.

According to this numerical controller, images of a workpiece and a tool during machining are captured by the video camera, display image data in which character information (a coordinate position of a tool cutting edge) is superimposed on a video image is generated by the display image generating means, and images relating to the generated display image data are displayed by the display apparatus. Besides, by arranging the position of display of the character information in the vicinity of the position related to the character information on the video image, the amount of movement of an operator's line of sight between the video image and the character information at the time of visually recognizing these display images are reduced.

SUMMARY OF THE DISCLOSURE

By the way, normally, when operating a machine tool, an operator checks a progress status of machining and a tool position as necessary during an automatic operation, while, during a manual operation, the operator checks a movement status of a tool or another movable structure moved by the operation (whether the movable structure is moved in an intended direction, etc.), and additionally performs safety check such as checking whether an interfering object exists ahead in the direction of movement.

However, the above-described numerical controller of the Patent Literature 1 merely displays images of the workpiece and the tool and information on a position coordinate of a tool cutting edge with the information superimposed on the image, and what the operator can recognize from the displayed images is limited to the position of the tool with respect to the workpiece and the position coordinate of the tool cutting edge.

Therefore, in the numerical controller of the Patent Literature 1, check of a movement status of a movable structure to determine whether the movable structure is moved in an intended direction and safety check to determine whether a movable structure can be moved without interference with an interfering object, which an operator needs to perform during a manual operation, cannot be performed.

The present disclosure has been achieved in view of the above-described circumstances, and an object thereof is to provide a display apparatus which enables an operator to, when moving a movable structure by a manual operation, check the status of the movement of the movable structure and the safety of the movement through a display image.

The present disclosure, for solving the above-described problems, relates to a display apparatus which is connected to a machine tool having structures including one or more movable structures, a driving mechanism unit driving the movable structures, a numerical controller controlling operation of the driving mechanism unit and an input device for inputting an operation signal into the numerical controller and which displays at least an image relating to the movable structures, comprising:

a display on which the image is displayed;

a model data storage unit storing therein at least three-dimensional model data relating to the movable structures and three-dimensional model data relating to other structures having a possibility of interfering with the movable structures in a movable area of the movable structures;

a model generation unit which reads out the three-dimensional model data stored in the model data storage unit and receives a signal relating to positions of the movable structures from the numerical controller, and generates a three-dimensional model in which three-dimensional models of the other structures are arranged in a three-dimensional space to have a determined positional relationship and a three-dimensional model of a corresponding movable structure is arranged in the three-dimensional space to have a received positional relationship;

an interference-caution-portion specifying unit which, when a signal which is for moving the movable structure and which relates to at least a moving direction of the movable structure is input from the input device into the numerical controller, receives the signal and executes a determination processing of determining, based on the three-dimensional model generated by the model generation unit, whether an interfering structure which will interfere with the movable structure when the movable structure moves in the received moving direction exists or not, and a specifying processing of, in a case where an interfering structure exists, specifying a portion of the movable structure having a possibility of contact with the interfering structure as an interference caution portion, and, in a case where an interfering structure does not exist, specifying a leading portion of the movable structure in the moving direction as an interference caution portion; and an image display unit which generates at least a display image of the movable structure based on the three-dimensional model generated by the model generation unit, and, in a case where an interference caution portion specified by the interference-caution-portion specifying unit, generates the display image with the interference caution portion of the movable structure highlighted, and displays the generated display image on the display.

According to this display apparatus, first, based on the three-dimensional model data stored in the model data storage unit, the model generation unit arranges three-dimensional models of the other structures in a three-dimensional space so that the other structures have a predetermined positional relationship, and generates a three dimensional model in which three-dimensional models of the movable structures are arranged in the three-dimensional space to have a positional relationship received from the numerical controller. Based on the generated three-dimensional model, the image display unit generates at least a display image of the movable structures and displays the generated display image on the display.

Then, when a signal which is for moving the movable structure and which relates to at least a moving direction of the movable structure is input from the input device into the numerical controller, the interference-caution-portion specifying unit also receives this signal and executes a determination processing of determining, based on the three-dimensional model generated by the model generation unit, whether an interfering structure which will interfere with the movable structure when the movable structure moves in the received moving direction exists or not and a specifying processing of, in a case where an interfering structure exists, specifying a portion of the movable structure having a possibility of contact with the interfering structure as an interference caution portion, and, in a case where an interfering structure does not exist, specifying a leading portion of the movable structure in the moving direction as an interference caution portion.

Further, when an interference caution portion is set by the interference-caution-portion specifying unit in this way, the image display unit generates the display image of the movable structure with the interference caution portion highlighted and displays the generated display image on the display. Note that, the mode of the highlighting display includes any mode that enables the interference caution portion to be distinguished from other portions, for example, displaying the set interference caution portion in a color different from that of the other portions, or displaying an arrow indicating the interference caution portion.

Thus, according to this display apparatus, when performing a manual operation, since the interference caution portion of the movable structure is displayed in a highlighted manner, an operator can recognize a portion of the movable structure as an operation target to which attention should be paid only by looking at a display image displayed on the display, which enables performing a more accurate safety check.

Further, in the case where an interfering structure exists, since the interference caution portion is a portion having a possibility of interference caused by movement of the movable structure, the interference caution portion is always set on the side of the moving direction of the movable structure. On the other hand, in the case where an interfering structure does not exist, the interference caution portion is set at a leading portion of the movable structure in the moving direction. Therefore, an operator can recognize the moving direction of the movable structure by checking the position of the interference caution portion on the movable structure, thereby easily confirming whether the movable structure is going to be moved in an intended direction.

In this display apparatus, it is preferred that the interference-caution-portion specifying unit is configured to, in the case where a determination is made that an interfering structure exists in the determination processing, further execute a processing of calculating a distance between the interference caution portion specified in the specifying processing and an interfering portion of the interfering structure and the image display unit is configured to display a value of the distance calculated by the interference-caution-portion specifying unit on the display.

According to this configuration, an operator can recognize the distance between the interference caution portion and the interfering structure objectively through a numerical value, and therefore can perform a suitable operation in accordance with this distance. That is, for example, the following action can be taken: in a case where the distance between the interference caution portion and the interfering structure is large, the movable structure as the operation target is moved at a high speed since the possibility of interference is small, while, in a case where the distance is small, the movable structure is moved at a low speed since the possibility of interference is large.

Further, in the display apparatus, it is preferred that the interference-caution-portion specifying unit is configured to further execute a processing of calculating a coordinate value of the interference caution portion specified in the specifying processing and the image display unit is configured to display the coordinate value of the interference caution portion calculated by the interference-caution-portion specifying unit on the display.

According to this configuration, an operator can recognize a current position of the interference caution portion specified on the movable structure objectively through a numerical value.

Note that, in a case where the interference caution portion has a certain area, a coordinate value of an arbitrary point within the area or a center portion of the area may be calculated and displayed, for example.

Further, in the display apparatus, it is preferred that the image display unit is configured to generate a display image viewed from a direction in which the interference caution portion specified by the interference-caution-portion specifying unit appears and display the generated display image on the display. There is a case where the interference caution portion is located in a blind spot which cannot be displayed on the image currently displayed on the display. Therefore, in such a case, by generating a display image viewed from a direction in which the interference caution portion appears, i.e. from such a direction that the interference caution portion is not located in a blind spot, and displaying the generated display image, the interference caution portion can be displayed on the display and can be recognized by an operator.

Further, a configuration may be adopted in which the display apparatus further comprises a position input unit for inputting a signal relating to a position specified on the display, the interference-caution-portion specifying unit is configured to further execute a processing of receiving a signal relating to a specified position on the display input from the position input unit and calculating a coordinate value corresponding to the specified position, and the image display unit is configured to display the coordinate value of the specified position calculated by the interference-caution-portion specifying unit on the display.

According to this configuration, for example, by specifying a desired position on the image of the movable structure and the image of the other structures displayed on the display, an operator can know coordinate values of the specified arbitrary portions, and, based on the coordinate values displayed, the operator can recognize a positional relationship and a distance between the specified portion of the movable structure and the specified portion of the other structures, and the like, for example.

As described above, according to the display apparatus of the present disclosure, when performing a manual operation, since an interference caution portion of the movable structure is displayed in a highlighted manner, an operator can recognize a portion of the movable structure as an operation target to which attention should be paid only by looking at a display image displayed on the display, which enables performing a more accurate safety check. Further, the operator can recognize the moving direction of the movable structure by checking the position of the interference caution portion on the movable structure, thereby easily confirming whether the movable structure is going to be moved in an intended direction.

Further, when the display apparatus is configured to display a distance between the interference caution portion and an interfering structure on the display, the operator can perform a suitable operation in accordance with the distance. Furthermore, when the display apparatus is configured to display a coordinate value of the interference caution portion, the operator can recognize a current position of the interference caution portion objectively through a numerical value.

Furthermore, when the display apparatus is configured to generate a display image viewed from a direction in which the interference caution portion appears and display it on the display, the operator can always recognize the interference caution portion on the display image, and in addition, when the display apparatus is configured to display a coordinate value of a position specified on the display on the display, the operator can know a coordinate value of an arbitrary portion which the operator wants to know.

BRIEF DESCRIPTION OF THE DRAWINGS

For a more complete understanding of the disclosed methods and apparatus, reference should be made to the embodiment illustrated in greater detail on the accompanying drawings, wherein.

It should be understood that the drawings are not necessarily to scale and that the disclosed embodiments are sometimes illustrated diagrammatically and in partial views. In certain instances, details which are not necessary for an understanding of the disclosed methods and apparatus or which render other details difficult to perceive may have been omitted. It should be understood, of course, that this disclosure is not limited to the particular embodiments illustrated herein.

DETAILED DESCRIPTION

Figure 1:
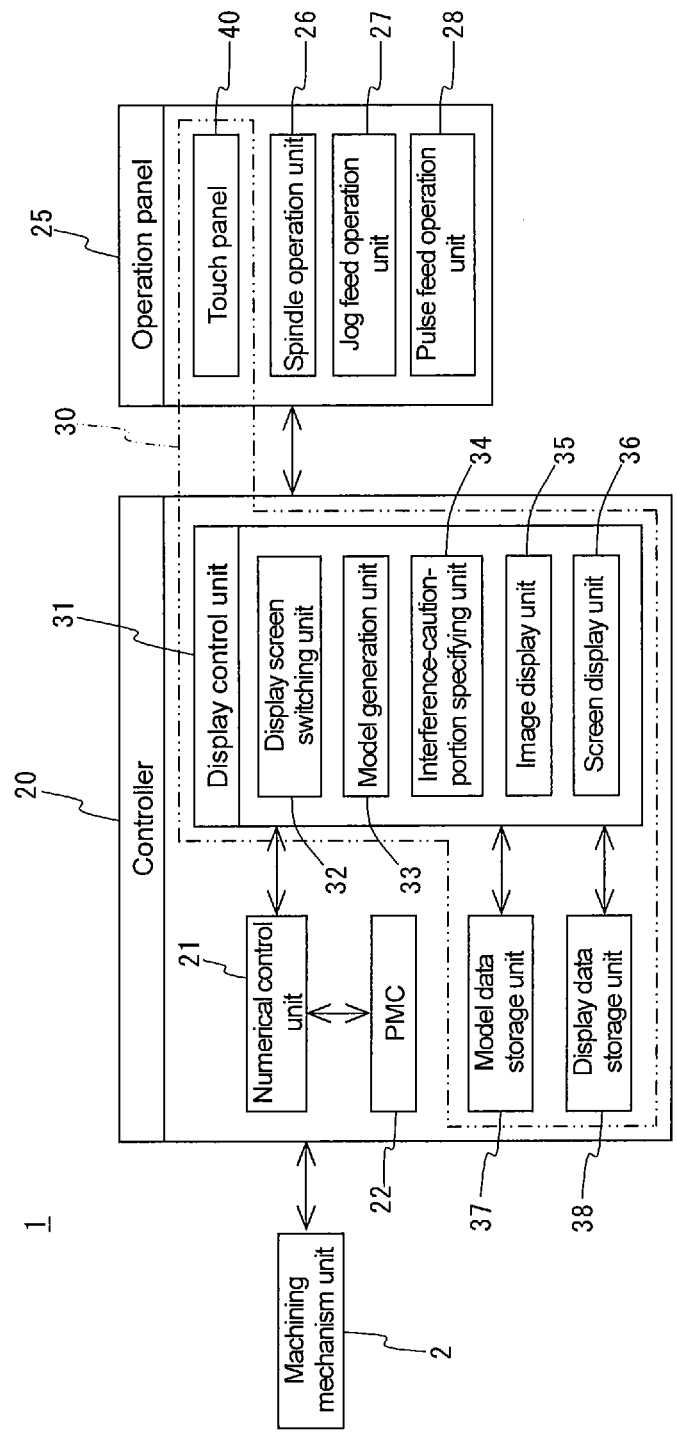
FIG. 1 is a block diagram showing a schematic configuration of a display apparatus and other components according to one embodiment of the present disclosure.
Figure 2:
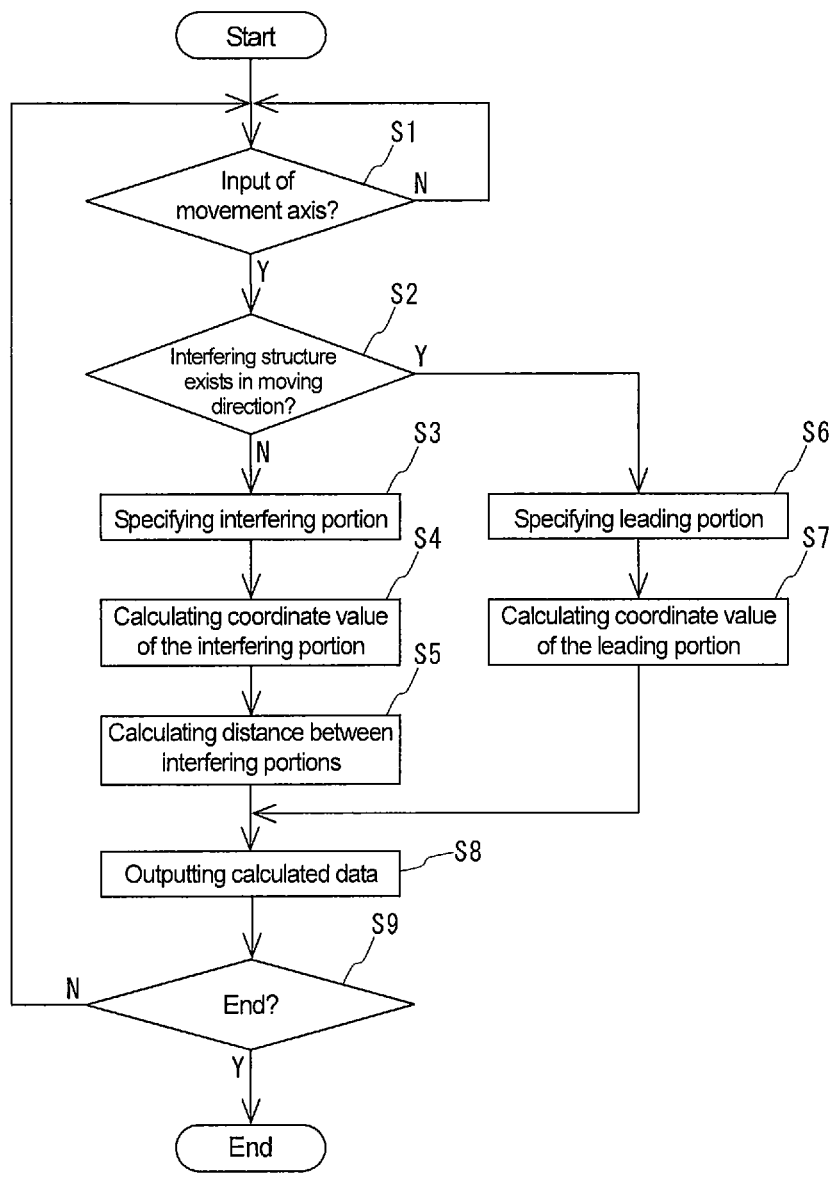
FIG. 2 is a flow chart showing a processing in an interference-caution-portion specifying unit of the embodiment.

Hereinafter, a specific embodiment of the present disclosure will be described with reference to FIGS. 1 to 4. As illustrated in FIG. 1, a display apparatus 30 of this embodiment is configured to be incorporated in a machine tool 1 and comprises a display control unit 31 and a touch panel 40.

First, a specific configuration of the machine tool 1 of this embodiment is described. Note that, FIGS. 3 and 4 are each an explanatory diagram showing an image display screen (image display area) 41 of the touch panel 40 and the reference numerals in parentheses in the figures denote components of the machine tool 1.

As illustrated in FIG. 1, the machine tool 1 of this embodiment comprises a machining mechanism unit 2, a controller 20 and an operation panel 25.

Figure 3:
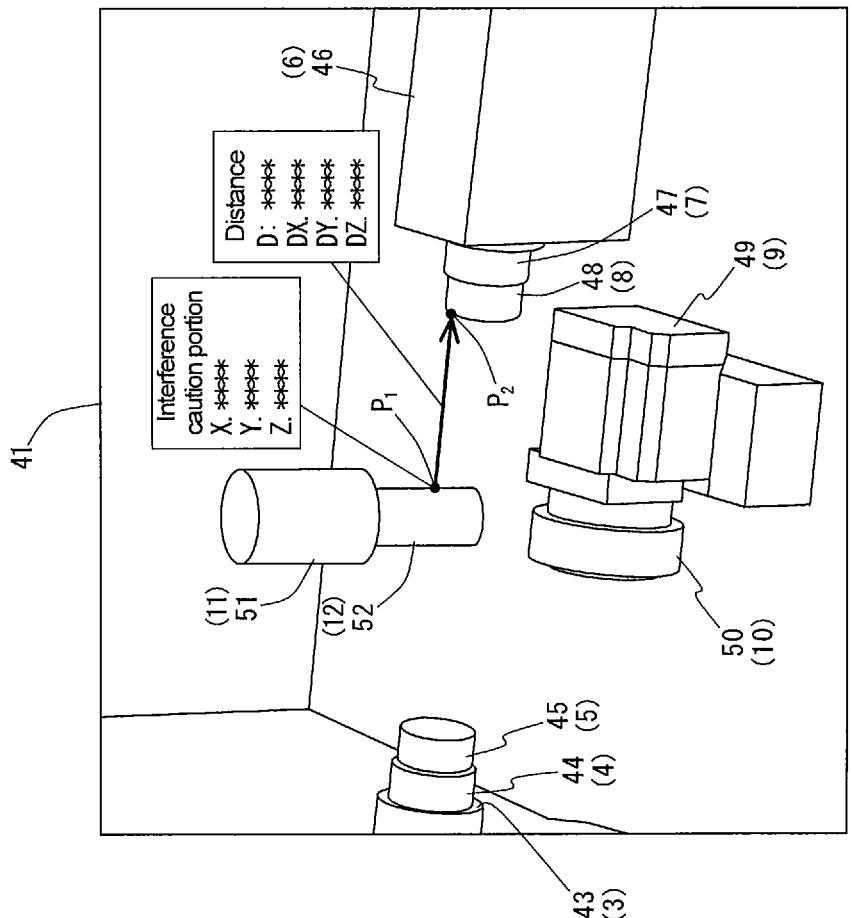
FIG. 3 is an explanatory diagram showing an image display screen of the embodiment.
Figure 4:
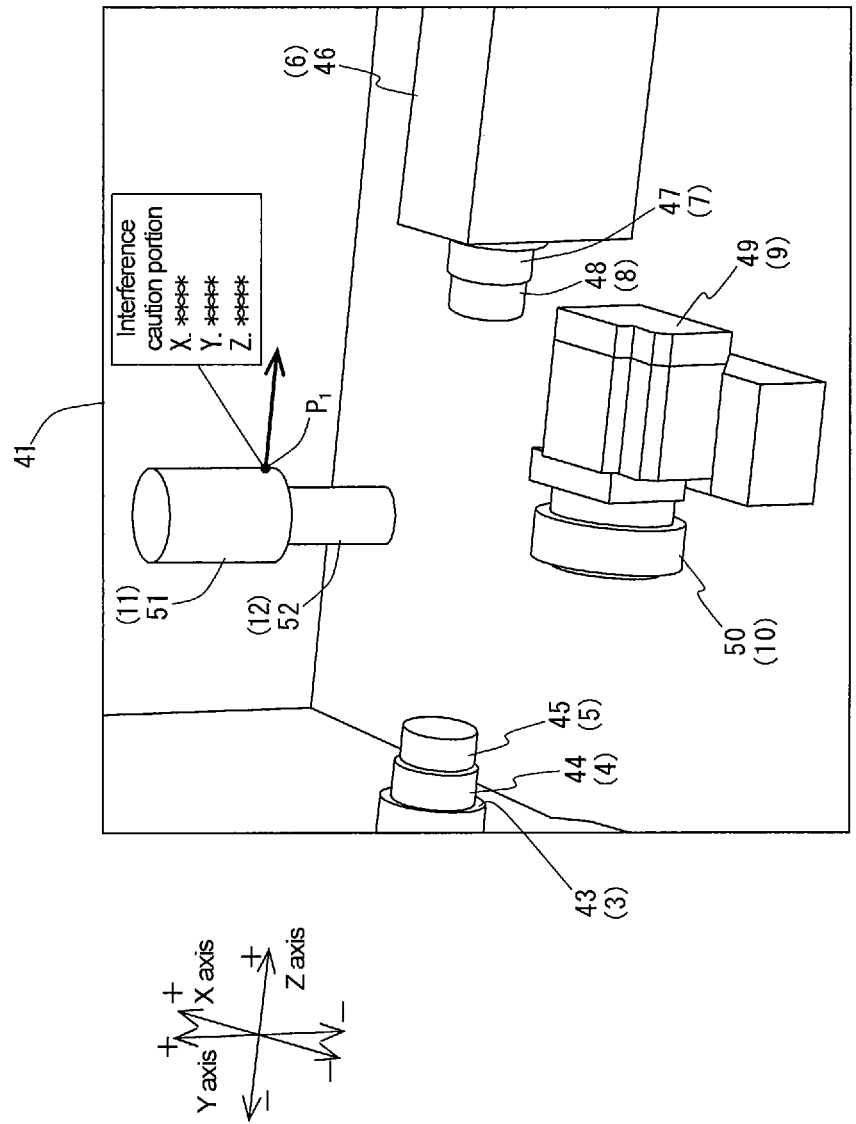
FIG. 4 is an explanatory diagram showing the image display screen of the embodiment.

The machining mechanism unit 2 includes a bed (not illustrated), and a first headstock 3, a second headstock 6, a tool rest 9 and a tool spindle 11 illustrated in FIGS. 3 and 4, which are disposed on the bed (not illustrated). The first headstock 3 has a first spindle 4 and a first chuck 5 disposed on an axial end of the first spindle 4, and, on the other hand, the second headstock 6 has a second spindle 7 and a second chuck 8 disposed on an axial end of the second spindle 7. The first headstock 3 and the second headstock 6 are disposed coaxially along Z axis of three orthogonal axes: X axis, Y axis and Z axis, so that the first chuck 5 and second chuck 8 are opposed mutually. Further, the first spindle 4 and second spindle 7 are each driven by an appropriate drive motor to rotate about their respective axes.

The tool rest 9 has a turret 10 and is configured to be moved in the X-axis and Z-axis directions by an appropriate feed mechanism, and the turret 10 is driven by an appropriate drive motor to rotate about its axis along the Z axis. Further, the tool spindle 11 is disposed to have its axis along the Y axis and has a tool 12 attached a lower end thereof. Further, the tool rest 11 is configured to be moved in the X-axis, Y-axis and Z-axis directions by an appropriate feed mechanism and is driven by an appropriate drive motor to rotate about its axis.

The tool rest 9 has a turret 10 and is configured to be moved in the X-axis and Z-axis directions by an appropriate feed mechanism, and the turret 10 is driven by an appropriate drive motor to rotate about its axis along the Z axis. Further, the tool spindle 11 is disposed to have its axis along the Y axis and has a tool 12 attached a lower end thereof. Further, the tool rest 11 is configured to be moved in the X-axis, Y-axis and Z-axis directions by an appropriate feed mechanism and is driven by an appropriate drive motor to rotate about its axis.

Note that, in this embodiment, the tool rest 9, the turret 10, the tool spindle 11 and the tool 12 correspond to the movable structures according to the present disclosure.

The controller 20 has a numerical control unit 21, a programmable machine controller (PMC) 22 and the display control unit 31 as illustrated in FIG. 1. Note that, since the display control unit 31 is a component of the display apparatus 30 as mentioned above, detailed explanation thereof will be described later.

The numerical control unit 21 controls the rotations of the first spindle 4 and the second spindle 7 in accordance with an NC program and numerically controls the movements of the tool rest 9 and the tool spindle 11. Further, the PMC 22 controls operations of the first chuck 5, the second chuck 8 and the turret 10, etc. in accordance with a predetermined operation program. Further, besides the control based on the programs, the numerical control unit 21 and the PMC 22 receive a manual operation signal input from the operation panel 25, which will be described later, and control the rotations of the first spindle 4, the second spindle 7 and the tool spindle 11, the movements of the tool rest 9 and the tool spindle 11, and the operations of the first chuck 5, the second chuck 8 and the turret 10, etc. in accordance with the received manual operation signal.

The operation panel 25 has the touch panel 40, a spindle operation unit 26, a jog feed operation unit 27 and a pulse feed operation unit 28, etc. Note that, since the touch panel 40 is a component of the display apparatus 30 as mentioned above, detailed explanation thereof will be described later.

The spindle operation unit 26 is an input device for inputting into the controller 20 signals for manually rotating the first spindle 4, the second spindle 7 and the tool spindle 11, and includes, for example, selection keys for selecting a target to be rotated from the first spindle 4, the second spindle 7 and the tool spindle 11 and driving keys for rotating the target to be rotated in a predetermined direction: a clockwise direction or a counterclockwise direction.

The jog feed operation unit 27 is an input unit for inputting into the controller 20 signals for moving the first tool rest 9 and the second tool rest 11 by jog feed, and, in this embodiment, has selection keys for selecting a target to be moved from the tool rest 9 and the tool spindle 11 and 6 keys for inputting jog feed directions: X-axis+, X-axis−, Y-axis+, Y-axis−, Z-axis+ and Z-axis−.

The pulse feed operation unit 28 is an input unit for inputting into the controller 20 signals for moving the tool rest 9 and tool spindle 11 by pulse feed, and has a pulse handle for generating a pulse signal and keys for selecting one from feed axes, i.e., the X axis, the Y axis and the Z axis, etc. Further, as for selection keys for selecting a target to be moved, the selections keys of the jog feed operation unit 27 are used also in the pulse feed operation unit 28.

Note that, the keys, switches and pulse handle, etc. for manual operations, which are provided on the operation panel 25, have configurations well known in the field of machine tools, and their configurations are not limited to the above-described ones also in this embodiment.

Next, a configuration of the display apparatus 30 of this embodiment is described. As described above, the display apparatus 30 includes the display control unit 31, a model data storage unit 37 and a display data storage unit 38, which are provided in the controller 20, and the touch panel 40, which is provided in the operation panel 25.

The touch panel 40 as a display has a predetermined display area, and when an operator touches the inside of the display area, the touch panel 40 performs a processing of transmitting a signal relating to the touched position as an input signal to the display control unit 31.

The model data storage unit 37 is a functional unit storing therein data relating to three-dimensional models of movable structures and other structures having a possibility of interference with the movable structures in a movable area of the movable structures among the structures of the machining mechanism unit 2. In this embodiment, three-dimensional model data relating to the first headstock 3, the first spindle 4, the first chuck 5, the second headstock 6, the second spindle 7, the second chuck 8, the tool rest 9, the turret 10, the tool spindle 11 and the tool 12 are stored therein in advance.

The display data storage unit 36 is a functional unit storing therein data relating to screens displayed in the display area of the touch panel 40 and data for displaying a table and soft keys, etc. in the screens and these data are stored therein in advance as appropriate. Note that, as the data relating to the display screens, an image display screen displaying a model image of structures of the machine tool 1, a soft key display screen displaying soft keys, a screen displaying an NC program, a screen displaying the numbers of rotation of the first spindle 4, the second spindle 7 and the tool spindle 11 (spindle rotation number display screen), and a screen displaying current positions of the tool rest 9 and the tool spindle 11 (movable body current position display screen), etc. are given as examples, and conventionally well-known various display screens are included.

The display control unit 31 includes a display screen switching unit 32, a model generation unit 33, an interference-caution-portion specifying unit 34, an image display unit 35 and a screen display unit 36 as illustrated in FIG. 1.

The display screen switching unit 32 is a processing unit which sets a screen displayed in the display area of the touch panel 40 with reference to the data stored in the display data storage unit 38 and is configured to be able to selectively set one of the image display screen, the soft key display screen, the NC program display screen, the spindle rotation number display screen, the movable body current position display screen, and the like as appropriate, or set a display screen in which these screens are selectively combined, for example. Note that, switching of the display screen can be performed by soft keys displayed on the touch panel 40, for example, and the display screen switching unit 32 switches the display screen to a display screen selected by the soft keys.

The screen display unit 36 is a processing unit which displays screens in the areas for the displays screens other than the image display screen among the display screens set by the display screen switching unit 32, and the screen display unit 36 performs a processing of displaying soft keys in a predetermined display area and a processing of receiving data relating to an NC program from the numerical control unit 21 and displaying the NC program, and additionally performs a processing of receiving data relating to the numbers of rotation of the first spindle 4, the second spindle 7 and the tool spindle 11 from the numerical control unit 21 and displaying the numbers of rotation and a processing of receiving data relating to current positions of the tool rest 9 and the tool spindle 11 from the numerical control unit 21 and displaying the current positions, for example.

The model generation unit 33 is a processing unit which reads out the three-dimensional model data stored in the model data storage unit 37 and generates a three-dimensional model in which three-dimensional models of the structures are arranged in a three-dimensional space as appropriate, and in this embodiment, a three-dimensional model is generated in which three-dimensional models of the structures other than the movable structures, i.e. three-dimensional models of the first headstock 3, the first spindle 4, the first chuck 5, the second headstock 6, the second spindle 7 and the second chuck 8 are arranged in a three-dimensional space to have the same arrangement as the actual arrangement and, based on position signals relating to the tool rest 9 and the tool spindle 11 which are received from the numerical control unit 21, the tool rest 9, the turret 10, the tool spindle 11 and the tool 12 as the movable structures are arranged in the three-dimensional space to have the received positional relationship.

Note that, when the tool rest 9 and the tool spindle 11 as the movable structures are moved under control by the numerical control unit 21 in accordance with manual operation signals (jog feed signals or pulse feed signals) input from the jog feed operation unit 27 or the pulse feed operation unit 28 of the operation panel 25 or in accordance with an automatic operation, the model generation unit 33 receives the position signals of the tool rest 9 and the tool spindle 11 from the numerical control unit 21 at predetermined time intervals and successively generates a three-dimensional model in which the tool rest 9, the turret 10, the tool spindle 11 and the tool 12 are arranged to have the received positional relation.

The interference-caution-portion specifying unit 34 is a processing unit which executes: a processing (determination processing) of, when a signal that is for moving the tool rest 9 or the tool spindle 11 as the movable structures (a movable structure to be operated, which is hereinafter referred to as "operated structure"), and relates to at least a moving direction is input into the numerical control unit 21 from the jog feed operation unit 27 or the pulse feed operation unit 28 of the operation panel 25, receiving this signal, and based on the three-dimensional model generated by the model generation unit 33, determining whether a structure (interfering structure) which will be interfere with the operated structure when the operated structure moves in the received moving direction exists or not; and a processing (specifying processing) of, in a case where an interfering structure exists, specifying a portion of the operated structure having a possibility of contact with the interfering structure as an interference caution portion, and in a case where an interfering structure does not exist, specifying a leading portion of the operated structure in the moving direction as an interference caution portion. Specifically, the interference-caution-portion specifying unit 34 executes the processing shown in FIG. 2.

That is, the interference-caution-portion specifying unit 34, after starting the processing, monitors whether a signal which is for moving an operated structure and relates to at least a moving direction of the operated structure (that is, a movement axis) is input into the numerical control unit 21 from the jog feed operation unit 27 or the pulse feed operation unit 28 (step S1).

Then, once it is confirmed that a signal relating to a movement axis is input, the interference-caution-portion specifying unit 34 receives this signal and checks, based on the three-dimensional model generated by the model generation unit 33, whether a structure which will interfere with the operated structure when the operated structure moves in the received movement axis exists or not, in other words, whether an interfering structure exists ahead in the moving direction of the operated structure in the movable area of the operated structure (step S2) or not, and in a case where it is confirmed that an interfering structure exists, a processing of specifying an interference caution portion of the operated structure is performed (step S3). Note that, the interference caution portion can be specified by performing a simulation in which the three-dimensional model of the operated structure (specifically, the tool rest 9 or the tool spindle 11) in the three-dimensional model generated by the model generation unit 33 is moved in the received moving direction, for example.

Next, the interference caution portion specifying unit 34 calculates a coordinate value of the interference caution portion specified in the step S3 based on the three-dimensional model generated by the model generation unit 33 (step S4) and calculates a distance between the interference caution portion and the interfering structure (step S5), and outputs them to the image display unit 35 (step S8).

On the other hand, in a case where, in the step S2, it is confirmed that an interfering structure does not exist, the interference-caution-portion specifying unit 34 specifies a leading portion of the operated structure in the moving direction as an interference caution portion based on the three-dimensional model generated by the model generation unit 33 (step S6), calculates a coordinate value of the specified interference caution portion (step S7), and outputs the calculated coordinate value to the image display unit 35 (step S8).

Note that, in a case where an interference caution portion has a certain area, a coordinate value of an arbitrary point within the area or a center portion of the area is calculated, for example.

Thereafter, the interference-caution-portion specifying unit 34 executes processes of the steps S1 to S9 repeatedly until the processing is completed.

The image display unit 35 generates, based on the three-dimensional model generated by the model generation unit 33, a display image including the first headstock 3, the first spindle 4, the first chuck 5, the second headstock 6, the second spindle 7, the second chuck 8, the tool rest 9, the turret 10, the tool spindle 11 and the tool 12, and displays the generated display image in the image display area of the touch panel 40.

Further, when an interfering caution portion is specified (set) on the operated structure by the interference-caution-portion specifying unit 34, the image display unit 35 generates an image in which the interference caution portion of the operated structure is highlighted and generates an image indicating a coordinate value of the interference caution portion and, in a case where an interfering structure exists, an image indicating the distance between the interference caution portion and the interfering structure, and superimposes the generated images and displays them in the image display area of the touch panel 40.

Examples of an image generated and displayed on the touch panel 40 as described above are illustrated in FIGS. 3 and 4. The image illustrated in FIG. 3 is an image generated in the case where an interfering structure exists, in which an interference caution portion $P_1$ set on the operated structure (in this example, the tool 12) is marked with a black dot and an interference position $P_2$ on the interfering structure (in this example, the second chuck 8) is marked with a black dot, and an arrow along the moving direction of the operated structure starting from the interference caution portion $P_1$ and ending at the interference position $P_2$ is illustrated. In addition, the coordinate value of the interference caution portion $P_1$ is displayed with a leader from the black dot indicating the interference caution portion $P_1$ and the distance between the interference caution portion $P_1$ and the interference position $P_2$ on the interfering structure is displayed with a leader from the arrow.

On the other hand, the image illustrated in FIG. 4 is an image generated in the case where an interfering structure does not exist, in which an interference caution portion $P_1$ set on the operated structure (in this example, the tool spindle 11) is marked with a black dot and an arrow along the moving direction of the operated structure starting from the interference caution portion $P_1$ is illustrated.

Note that, in FIGS. 3 and 4, in the case where the interference caution portion $P_1$ has a certain area and a coordinate value of an arbitrary point within the area or a center portion of the area is calculated, the coordinate position is displayed with a leader from the calculated point.

Thus, the images illustrated in FIGS. 3 and 4 are images in which the interference caution portion $P_1$ is highlighted by marking the interference caution portion $P_1$ with a black dot and illustrating an arrow starting therefrom. However, a method of highlighting the interference caution portion $P_1$ is not limited thereto, and any method enabling the interference caution portion $P_1$ to be distinguished from other portions may be adopted, for example, highlighting without the black dot, highlighting without the arrow, or highlighting with a dot of another color or another mark, and in the case where the interference caution portion $P_1$ has a predetermined area, adding a contour line of the area or adding the same color as that of the contour line or a color different therefrom within the area, or displaying an arrow indicating the interference caution portion $P_1$.

Note that, in FIGS. 3 and 4, the reference 41 denotes the image display area. Further, the reference 43 denotes an image of the first headstock 3, the reference 44 denotes an image of the first spindle 4, the reference 45 denotes an image of the first chuck 5, the reference 46 denotes an image of the second headstock 6, the reference 47 denotes an image of the second spindle 7 and the reference 48 denotes an image of the second chuck 8. Further, the reference 49 denotes an image of the tool rest 9, the reference 50 denotes an image of the turret 10, the reference 51 denotes an image of the tool spindle 11 and the reference 52 denotes an image of the tool 12. In addition, in FIGS. 3 and 4, each of the references and the leaders thereof does not form the image. This is applied also to FIG. 5 described later.

In addition, the image display unit 35 is configured to, in a case where the interference caution portion does not appear on the display image when viewed from the viewpoint of the currently displayed display image, i.e. in a case where the interference caution portion is located in a blind spot when viewed from the viewpoint, generate a display image viewed from a direction in which the interference caution portion appears. As specific modes thereof, a mode of generating an image which is formed by reversing the front and back of the currently displayed image, and a mode of generating an image which is formed by viewing the currently displayed image from the upper side thereof can be given, for example.

Further, in the case where one or both of the tool rest 9 and the tool spindle 11 are driven and moved by an automatic operation or a manual operation and a three-dimensional model is generated successively by the model generation unit 33, the image display unit 35 generates a display image successively in accordance with the generation of the three-dimensional model and displays the display image on the image display area 41.

According to the display apparatus 30 of this embodiment having the above-described configuration, screens set by the display screen switching unit 32 are displayed on the touch panel 40 of the operation panel 25, and, in the areas other than the image display area 41 among the displayed screen areas, screens are displayed by the screen display unit 36 as appropriate.

On the other hand, in the image display area 41, an image generated by the image display unit 35 based on the three-dimensional model generated by the model generation unit 35 is displayed. Further, when a manual operation signal is input from the jog feed operation unit 27 or the pulse feed operation unit 28, an interference caution portion $P_1$ is specified by the interference-caution-portion specifying unit 34 on an operated structure, and the image display unit 35 generates, for example, an image in which the interference caution portion $P_1$ is highlighted and on which a display indicating a coordinate position of the interference caution portion $P_1$ and a display indicating a distance to an interference position $P_2$ of an interfering structure are superimposed, and displays it on the image display area 41, as illustrated in FIG. 3.

Thus, according to the display apparatus 30 of this embodiment, when performing a manual operation, since the interference caution portion $P_1$ of the operated structure is displayed in a highlighted manner with an arrow indicating the moving direction thereof, an operator can easily recognize a portion of the operated structure to which attention should be paid and the moving direction thereof only by looking at the display image displayed on the touch panel 40, which enables performing a more accurate safety check.

Note that, since the interference caution portion $P_1$ is a portion having a possibility of interference caused by movement, in the case where an interfering structure exists, the position thereof is always on the side of the moving direction of the operated structure, and in the case where an interfering structure does not exist, it is set on a leading portion of the operated structure in the moving direction. Therefore, even if an image without the arrow indicating the moving direction is displayed, an operator can recognize the moving direction of movement of the operated structure by checking the position of the interference caution portion $P_1$ on the operated structure, and therefore can easily confirm whether the operated structure is going to be moved in an intended direction.

In addition, since a distance between the interference caution portion and the interfering structure is displayed, an operator can recognize the distance between the interference caution portion $P_1$ and the interfering structure objectively through a numerical value, and therefore can perform a suitable operation in accordance with this distance. For example, the following action can be taken: in a case where the distance between the interference caution portion $P_1$ and the interfering structure is small, the operated structure is moved at a high speed since the possibility of interference is small, and in a case where the distance is small, the operated structure is moved at a low speed since the possibility of interference is large.

In addition, since a coordinate value of the interference caution portion $P_1$ is displayed, an operator can recognize a current position of the interference caution portion $P_1$ of the operated structure objectively through a numerical value.

In addition, since, in the case where the interference caution portion $P_1$ is located in a blind spot which cannot be displayed on the image currently displayed on the display, an image viewed from a direction in which the interference caution portion $P_1$ appears, i.e. such a direction that the interference caution portion $P_1$ is not located in a blind spot, is displayed, an operator can always recognize the interference caution portion $P_1$.

Thus, a specific embodiment of the present disclosure has been described. However, the mode which can be adopted by the present disclosure is not limited thereto.

For example, the interference-caution-portion specifying unit 34 may be configured to, when an operator presses down an arbitrary position within the image display area 41 of the touch panel 40 and thereby a position signal (signal relating to the specified position) is input, execute a processing of calculating a coordinate value corresponding to the specified position, and the image display unit 35 may be configured to display the coordinate value of the specified position calculated by the interference-caution-portion specifying unit 34 on the image display area 41.

Figure 5:
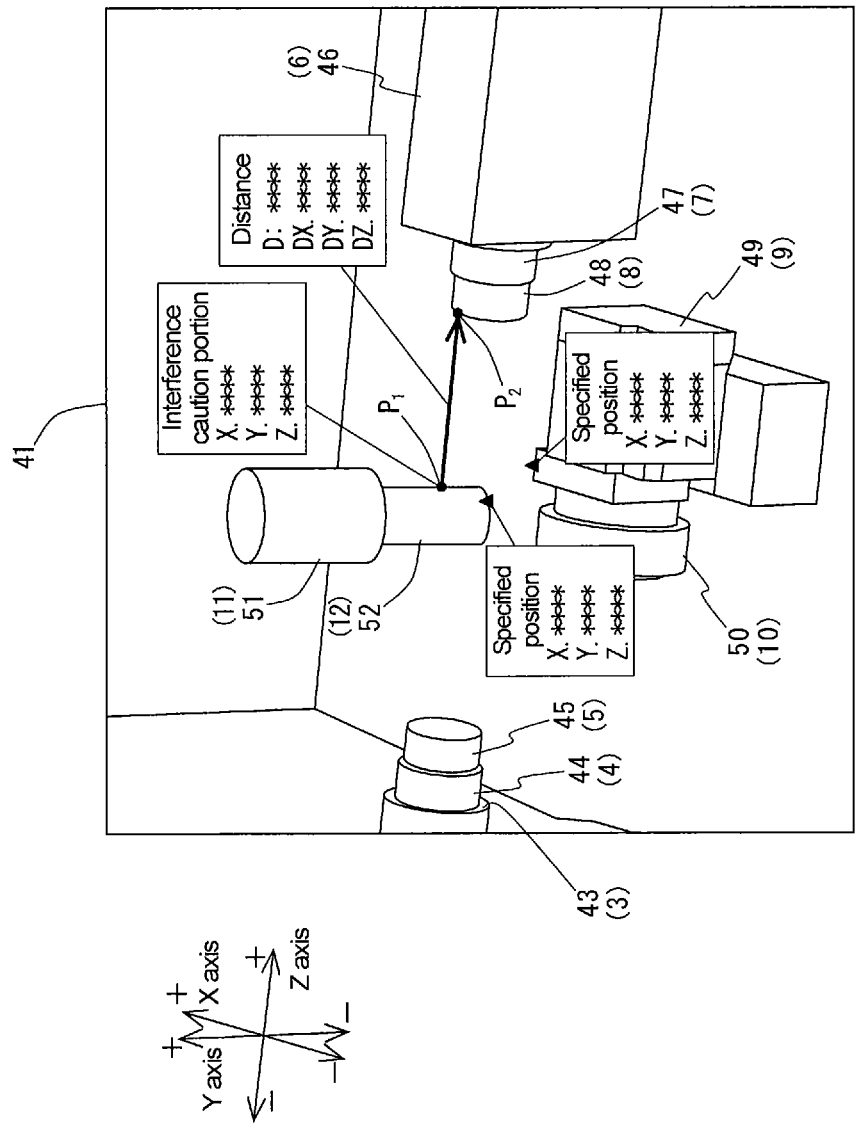
FIG. 5 is an explanatory diagram showing an image display screen according to another embodiment of the present disclosure.

An example of such an image is shown in FIG. 5. In the example shown in FIG. 5, by an operator pressing down an image 52 of the tool 12 and an image 49 of the tool rest 9, coordinate values of the positions thereof (positions indicated by ▲) are displayed.

According to such configuration, for example, by specifying a desired position on the image of the movable structures and the image of the other structures displayed on the image display area 41, an operator can know coordinate values of the specified arbitrary positions, and based on the displayed coordinate values, the operator can recognize a positional relationship and a distance between the specific portion of the movable structure and the specific portion of the other structures, etc.

What is claimed is:

1. A display apparatus which is connected to a machine tool having structures including one or more movable structures, a driving mechanism unit driving the movable structures, a numerical controller controlling operation of the driving mechanism unit and an input device for inputting an operation signal into the numerical controller and which displays at least an image relating to the movable structures, the display apparatus comprising:
   a display on which the image is displayed;
   a model data storage storing therein at least three-dimensional model data relating to the movable structures and three-dimensional model data relating to other structures having a possibility of interfering with the movable structures in a movable area of the movable structures;
   a model generator which reads out the three-dimensional model data stored in the model data storage and receives a signal relating to positions of the movable structures from the numerical controller, and generates a three-dimensional model in which three-dimensional models of the other structures are arranged in a three-dimensional space to have a determined positional relationship and a three-dimensional model of a corresponding movable structure is arranged in the three-dimensional space to have a received positional relationship;
   an interference-caution-portion specifying processor which, when a signal which is for moving the movable structure and which relates to at least a moving direction of the movable structure is input from the input device into the numerical controller, receives the signal and executes a determination processing of determining, based on the three-dimensional model generated by the model generator, whether an interfering structure which will interfere with the movable structure when the movable structure moves in the received moving direction exists or not, and a specifying processing of, in a case where an interfering structure exists, specifying a portion of the movable structure having a possibility of interference with the interfering structure as an interference caution portion, and, in a case where an interfering structure does not exist, specifying a leading portion of the movable structure in the moving direction as an interference caution portion; and
   an image display unit which generates at least a display image of the movable structure based on the three-dimensional model generated by the model generator, and, in a case where an interference caution portion specified by the interference-caution-portion specifying processor exists, generates the display image in which the interference caution portion of the movable structure is highlighted and in which in the case where a determination is made that an interfering structure exists in the determination processing, an arrow starting from the interference caution portion and ending at an interfering portion of the interfering structure is illustrated, and in the case where a determination is made that an interfering structure does not exist, an arrow along the moving direction starting from the interference caution portion is illustrated, and displays the generated display image on the display.

2. The display apparatus according to claim 1, wherein:
   the interference-caution-portion specifying processor is configured to, in the case where a determination is made that an interfering structure exists in the determination processing, further execute a processing of calculating a distance between the interference caution portion specified in the specifying processing and an interfering portion of the interfering structure; and
   the image display unit is configured to display a value of the distance calculated by the interference-caution-portion specifying processor on the display.

3. The display apparatus according to claim 1, wherein:
   the interference-caution-portion specifying processor is configured to further execute a processing of calculating a coordinate value of the interference caution portion specified in the specifying processing; and
   the image display unit is configured to display the coordinate value of the interference caution portion calculated by the interference-caution-portion specifying processor on the display.

4. The display apparatus according to claim 1, wherein the image display unit is configured to generate a display image viewed from a direction in which the interference caution portion specified by the interference-caution-portion specifying processor appears and display the generated display image on the display.

5. The display apparatus according to claim 1, further comprising a position input unit for inputting a signal relating to a position specified on the display, wherein:
   the interference-caution-portion specifying processor is configured to further receive a signal relating to a specified position on the display input from the position input unit and execute a processing of calculating a coordinate value corresponding to the specified position; and
   the image display unit is configured to display the coordinate value of the specified position calculated by the interference-caution-portion specifying processor on the display.

* * * * *